(12) United States Patent
Loopstra et al.

(10) Patent No.: US 8,264,670 B2
(45) Date of Patent: Sep. 11, 2012

(54) LITHOGRAPHIC APPARATUS AND DEVICE MANUFACTURING METHOD FOR CLAMPING A PATTERNING DEVICE

(75) Inventors: Erik Roelof Loopstra, Heeze (NL); Bernardus Antonius Johannes Luttikhuis, Nuenen (NL); Harmen Klaas Van Der Schoot, Vught (NL); Fransicus Mathijs Jacobs, Asten (NL)

(73) Assignee: ASML Netherlands B.V., Veldhoven (NL)

( * ) Notice: Subject to any disclaimer, the term of this patent is extended or adjusted under 35 U.S.C. 154(b) by 822 days.

(21) Appl. No.: 11/343,219

(22) Filed: Jan. 31, 2006

(65) Prior Publication Data

US 2007/0178704 A1    Aug. 2, 2007

(51) Int. Cl.
*G03B 27/62* (2006.01)
(52) U.S. Cl. .......................................... 355/76
(58) Field of Classification Search .................... 355/76, 355/75, 72–74, 53; 269/21
See application file for complete search history.

(56) References Cited

U.S. PATENT DOCUMENTS

| 4,993,696 | A   * | 2/1991  | Furukawa et al. | 269/73 |
| 6,323,935 | B1  * | 11/2001 | Ebihara et al.  | 355/53 |
| 6,864,955 | B2  * | 3/2005  | Nishi et al.    | 355/53 |
| 2003/0197841 | A1 * | 10/2003 | Araki et al. | 355/50 |

* cited by examiner

*Primary Examiner* — Peter B Kim
*Assistant Examiner* — Chia-how Michael Liu
(74) *Attorney, Agent, or Firm* — Sterne, Kessler, Goldstein & Fox P.L.L.C.

(57) ABSTRACT

The invention provides a lithographic apparatus including an illumination system configured to condition a radiation beam, a patterning device support constructed to support a transmissive patterning device, the patterning device being capable of imparting the radiation beam with a pattern in its cross-section to form a patterned radiation beam, a substrate table constructed to hold a substrate, and a projection system configured to project the patterned radiation beam onto a target portion of the substrate, wherein the patterning device support is configured to hold a patterning device and wherein the lithographic apparatus includes a clamping device, the clamping device being configured to clamp the patterning device at the top side.

31 Claims, 3 Drawing Sheets

LITHOGRAPHIC APPARATUS AND DEVICE MANUFACTURING METHOD FOR CLAMPING A PATTERNING DEVICE

BACKGROUND

1. Field of the Invention

The present invention relates to a lithographic apparatus and a method for manufacturing a device.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In the known lithographic apparatus a patterning device support is used, which carries a transmissive patterning device during projection of a pattern on a substrate. This known patterning device support carries the patterning device on a top side thereof, the patterning device resting with its bottom side on the patterning device support, in particular on a number of supporting elements being arranged on the top side of the patterning device support.

It is desirable to avoid (micro)slip between the patterning device and the patterning device support during acceleration of the patterning device support, since this may lead to image deformations, and therewith to poor product quality. The acceleration in the known lithographic apparatus is typically 80-120 m/s$^2$. In order to avoid micro slip, the known lithographic apparatus includes a clamping device to clamp the patterning device on the patterning device support. The clamping force of the clamping device provides a friction force which prevents microslip at the acceleration levels of the known lithographic apparatus.

A known clamping device is a vacuum device which creates a vacuum between the bottom side of a patterning device and the patterning device support. Since the patterning device is of the transmissive type, only a part of the surface of the patterning device may be used to apply a vacuum to. Typically, only a part of the circumferential area, i.e. close to the edge of the patterning device, may be free to apply a vacuum force.

A modified lithographic apparatus is designed with the goal to increase the throughput of the apparatus. To reach this goal, it is desirable to increase the acceleration rates of the patterning device support, for instance at least 200 m/s$^2$, typically about 600 m/s$^2$. However, at these acceleration rates, the risk of microslip substantially increases.

Furthermore, in the known lithographic apparatus, the vacuum device takes a considerably long time to create a vacuum level which is sufficiently low to avoid micro slip between the patterning device support and the patterning device or to take away the vacuum pressure after the projection phase to make exchange of the patterning device possible. It will be clear that during this time needed to obtain a certain desired vacuum level, the patterning device support cannot be accelerated. Therefore, the decrease of the time needed to obtain a required pressure level, will lead to an increase of the throughput of the lithographic apparatus.

SUMMARY

It is desirable to improve the throughput of the lithographic apparatus, wherein microslip between the patterning device support and the patterning device supported thereon is avoided, and wherein the time needed to obtain a certain vacuum level required to avoid microslip is decreased.

According to an embodiment of the invention, there is provided a lithographic apparatus including:
an illumination system configured to condition a radiation beam;
a patterning device support constructed to support a transmissive patterning device, the patterning device being capable of imparting the radiation beam with a pattern in its cross-section to form a patterned radiation beam;
a substrate table constructed to hold a substrate; and
a projection system configured to project the patterned radiation beam onto a target portion of the substrate,
wherein the patterning device support is configured to hold a patterning device and wherein the lithographic apparatus includes a clamping device, the clamping device being configured to clamp the patterning device at the top side.

According to an embodiment of the invention, there is provided a lithographic apparatus including:
an illumination system configured to condition a radiation beam;
a patterning device support constructed to support a transmissive patterning device, the patterning device being capable of imparting the radiation beam with a pattern in its cross-section to form a patterned radiation beam;
a substrate table constructed to hold a substrate; and
a projection system configured to project the patterned radiation beam onto a target portion of the substrate,
wherein the patterning device support is configured to hold a patterning device and wherein the lithographic apparatus includes two or more types of clamping devices, the two or more types of clamping devices being configured to exert a clamping force on substantially overlapping areas of a side of the patterning device.

According to an embodiment of the invention, there is provided a device manufacturing method including projecting a patterned beam of radiation onto a substrate, wherein a transmissive patterning device is used to provide a pattern in the beam of radiation, wherein during projection the patterning device is being held at the underside of a patterning device support, the patterning device being clamped at its top side.

According to an embodiment of the invention, there is provided a device manufacturing method including projecting a patterned beam of radiation onto a substrate, wherein a transmissive patterning device is used to provide a pattern in the beam of radiation, wherein during projection the patterning device is being clamped by two or more types of clamping devices, wherein the two or more types of clamping devices exert a clamping force on substantially overlapping areas of a side of the patterning device.

In an embodiment of the invention, there is provided a device manufacturing method including holding a patterning device with a patterning device support; patterning a beam of radiation with the patterning device to form a patterned beam of radiation; and projecting the patterned beam of radiation onto a substrate, wherein the holding includes clamping the patterning device at a top side thereof to an underside of the patterning device support.

In another embodiment of the invention, there is provided a device manufacturing method including patterning a beam of radiation with the patterning device to form a patterned beam of radiation; projecting the patterned beam of radiation onto a substrate, and during projection of the patterned beam, exerting a clamping force on substantially overlapping areas of a side of the patterning device with two or more types of clamping devices.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
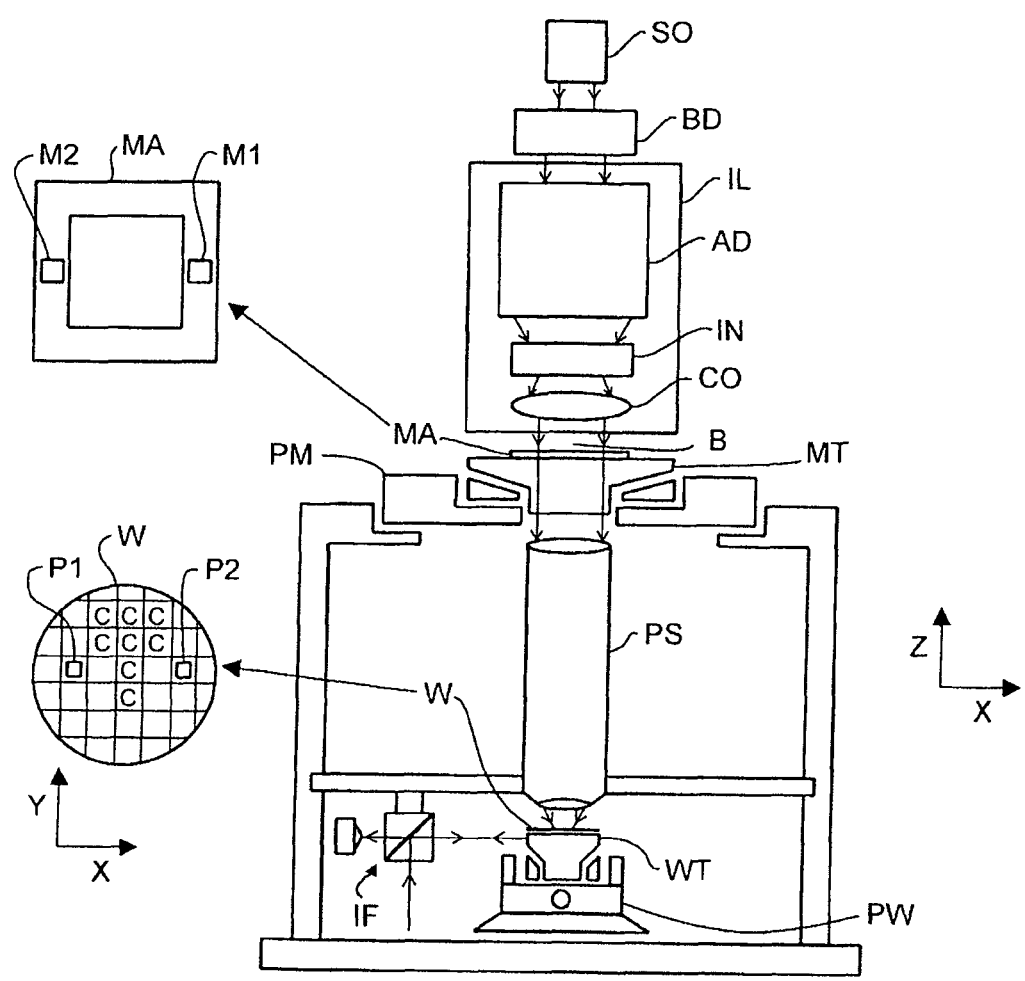
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system.

Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner), the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
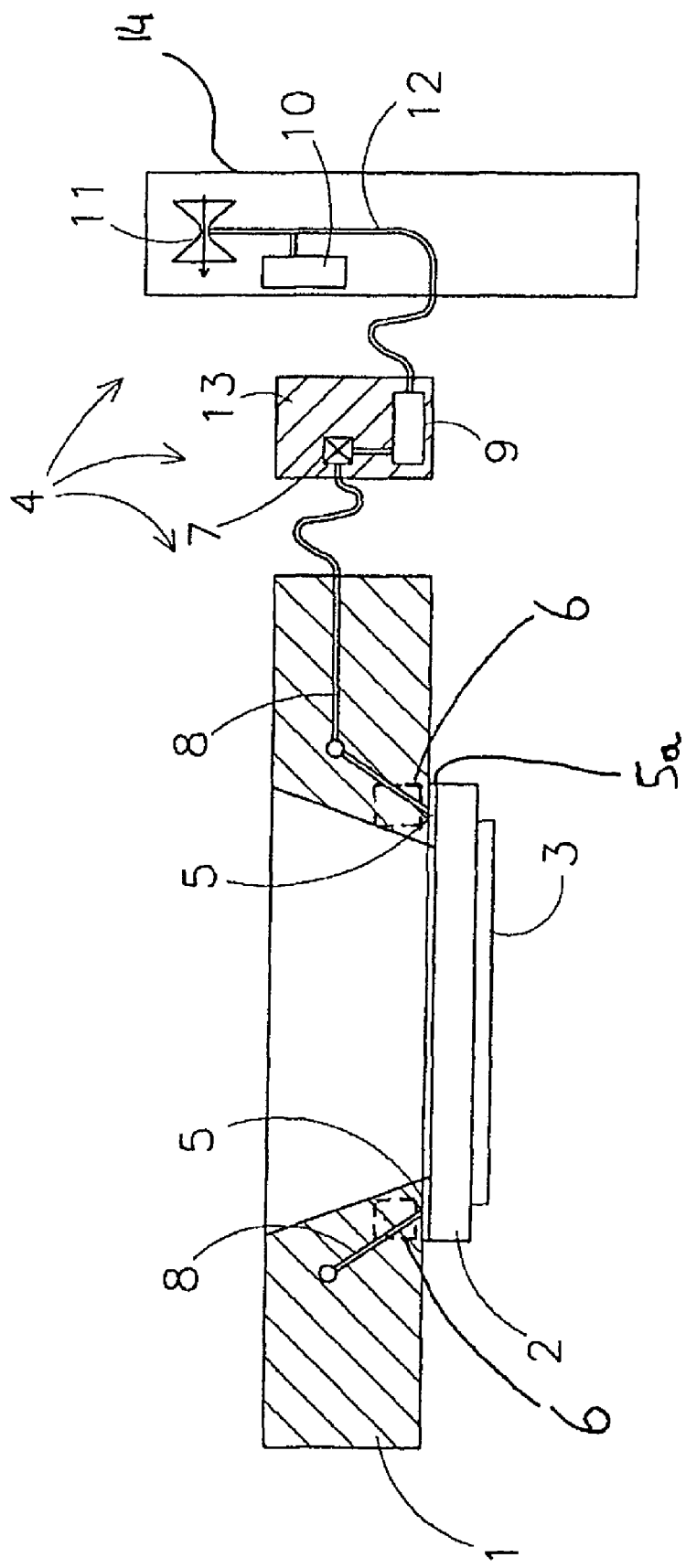
FIG. 2 depicts a patterning device support supporting a patterning device according to a first embodiment of the invention.

FIG. 2 shows a patterning device support 1 carrying at its underside a patterning device 2. This patterning device support 1 is part of an alternative embodiment of the known lithographic apparatus which aims to provide a higher throughput than the known device. In the patterning device support 1 of this alternative embodiment, the patterning device 2 is held at the underside of the patterning device support 1 because this makes a quicker exchange of patterning devices 2 possible and hence a larger throughput of the lithographic apparatus. Moreover, it is advantageous when such quicker exchange is possible in the case the lithographic apparatus is used for certain applications which require more exchanges of the patterning device per substrate or batch of substrates. Such applications may include stitching with four or more patterning devices and double exposure jobs.

The patterning device 2 is of the transmissive type, i.e. the projection beam travels through the patterning device 2. Since the patterning device 2 is of the transmissive type the major part, in particular the central part of the patterning device 2 can not be used for clamping it, since any clamping device in this part will interfere with the projection beam. Therefore, the space which can be used to clamp a patterning device is limited. In particular the patterning device can only be held at certain locations at its edges.

In the lithographic apparatus a pellicle 3 is placed against the underside of the patterning device 2 to avoid that particles such as dust will stick on the bottom side of the patterning device 2 therewith avoiding the risk of any errors in the pattern imparted to the beam by the patterning device 2. To make sure that any particles come close to the pattern of the patterning device 2, the pellicle 3 has a size which is substantially larger than the area of the pattern of the patterning device 2 which results in an even smaller area which can be used for clamping the patterning device to the patterning device support 1.

As indicated above, it is desirable to increase the throughput of the lithographic apparatus. Such increase of the throughput may be obtained by increasing the rate with which the patterning device support 1 may be accelerated. In the known lithographic device this acceleration rate typically lies within the range of about 80-100 m/s$^2$. In the present alternative embodiment aimed at higher throughput, accelerations rates of at least about 200 m/s$^2$ typically about 600 m/s$^2$ are desired. As a consequence, the risk on microslip between the patterning device and patterning device support may increase. Such microslip is undesired as it will lead to image deformations and therefore to poor product quality.

In the embodiment of FIG. 2, a vacuum device 4 is used to clamp the patterning device 2 on the patterning device support 1. This vacuum device 4 includes a vacuum pad 5 which is placed against the patterning device 2 so that there is a space 5a between the patterning device 2 and the patterning device support 1 in which the air pressure can be lowered to create a clamping force.

In order to have at a certain vacuum level a maximum clamping force, the vacuum pad 5 of the vacuum device 4 is placed against the top side of the patterning device 2 so that the vacuum force can be applied on the top side of the patterning device 2. This is beneficial since the area available for creating the vacuum clamping (or any other type of clamping) on the top side of the patterning device is larger than the area available on the bottom side of the patterning device, since against this bottom side the pellicle 3 is placed as was described above. Since the area on the top side of the patterning device 2 available for clamping is substantially larger, larger clamping forces can be obtained between the patterning device support 1 and the patterning device 2 so that microslip is avoided for higher acceleration rates.

To make even higher acceleration rates of the patterning device support possible, the lithographic apparatus may include another clamping device, preferably of another type, in order to increase the total clamping force. This other type of clamping device preferably exerts the clamping force on the same part of the patterning device since the available area is limited. For example, in the embodiment of FIG. 2, the patterning device support includes a number of electrostatic clamping devices 6 which exert a clamping force on substantially the same part of the patterning device as the vacuum device 4. With this embodiment, the clamping force per available surface area is substantially increased. Furthermore since the same top side is used for clamping the patterning device, there is less risk on reticle deformation and therefore there is a better image quality. This benefit of clamping on the same side of the patterning device may also be obtained by clamping on the bottom side of the patterning device 2. This may for instance be an alternative if no clamping device can be arranged above the top side of the patterning device 2.

In the embodiment of FIG. 2, a combination of a vacuum device 4 and an electrostatic device 6 for clamping the patterning device is used. According to an embodiment of the invention, it is also possible to use any other type or combination of types of clamping devices such as magnetic, electromagnetic and hydraulic clamping devices. In an embodiment, the two types of clamping devices exert a clamping force on the same part, i.e. in substantially overlapping areas, of the patterning device so that the available clamping surface area on the patterning device 2 is optimally used.

Now, the vacuum device 4 shall be discussed in more detail. The vacuum device 4 includes a number of vacuum pads 5 located on the patterning device support. The vacuum device 4 further includes a vacuum valve 7 which is used to maintain a vacuum when a patterning device is placed on the patterning device support 1. The vacuum valve 7 is connected with the one or more vacuum pads with a vacuum line 8. Further, the vacuum device includes a number of vacuum sources, such as a first vacuum buffer 9, a second vacuum buffer 10 and a vacuum pump 11. These vacuum sources 9, 10 and 11 are connected with the vacuum valves by further vacuum lines 12.

In the known lithographic apparatus, the vacuum valve 7 of the vacuum device 4 is located on a stationary frame of the lithographic apparatus. According to an embodiment of the present invention, this vacuum valve 7 is located on the patterning device support 1 or close to the patterning device support 1. In this context, the recitation 'close to' means that the vacuum valve is located on a position closer to the patterning device support than a stationary frame (whereby the distance is determined by the vacuum line 8 between the vacuum valve and the vacuum pads 5.) By locating the vacuum valve 7 closer to one or more vacuum pads 5, the time needed to take away the vacuum to make exchange of a patterning device 1 possible is lower since the vacuum line has to be filled with less gas/air to bring the pressure within the vacuum line to substantially the pressure level of the local environment.

In general the location close to the patterning device support 1 will be on or in an object which moves or at least partially moves together with the patterning device support 1.

In a preferred embodiment, as shown in FIG. 2 the vacuum valve 7 is located on the cable support 13 which moves together with the patterning device support 1. As a result, the distance between the vacuum valve 7 and the one or more vacuum pads is decreased, therewith decreasing the time needed to exchange a patterning device 2 for another patterning device 2.

In the embodiment of FIG. 2, a vacuum buffer 9 is located close to the vacuum pads 5, namely on the cable support 13. With a vacuum source closer to the patterning device support 1, the time needed to obtain a sufficient low pressure level to close the vacuum valve is decreased making an ever quicker exchange of patterning devices possible.

The second vacuum buffer 10 and the vacuum pump 11 are arranged on a stationary frame 14. However, in alternative embodiments also other vacuum sources may be located close to the patterning device support such as vacuum pumps. As these parts are located on a moving part, it is desirable that these parts of the vacuum device 4 be low in weight.

Figure 3:
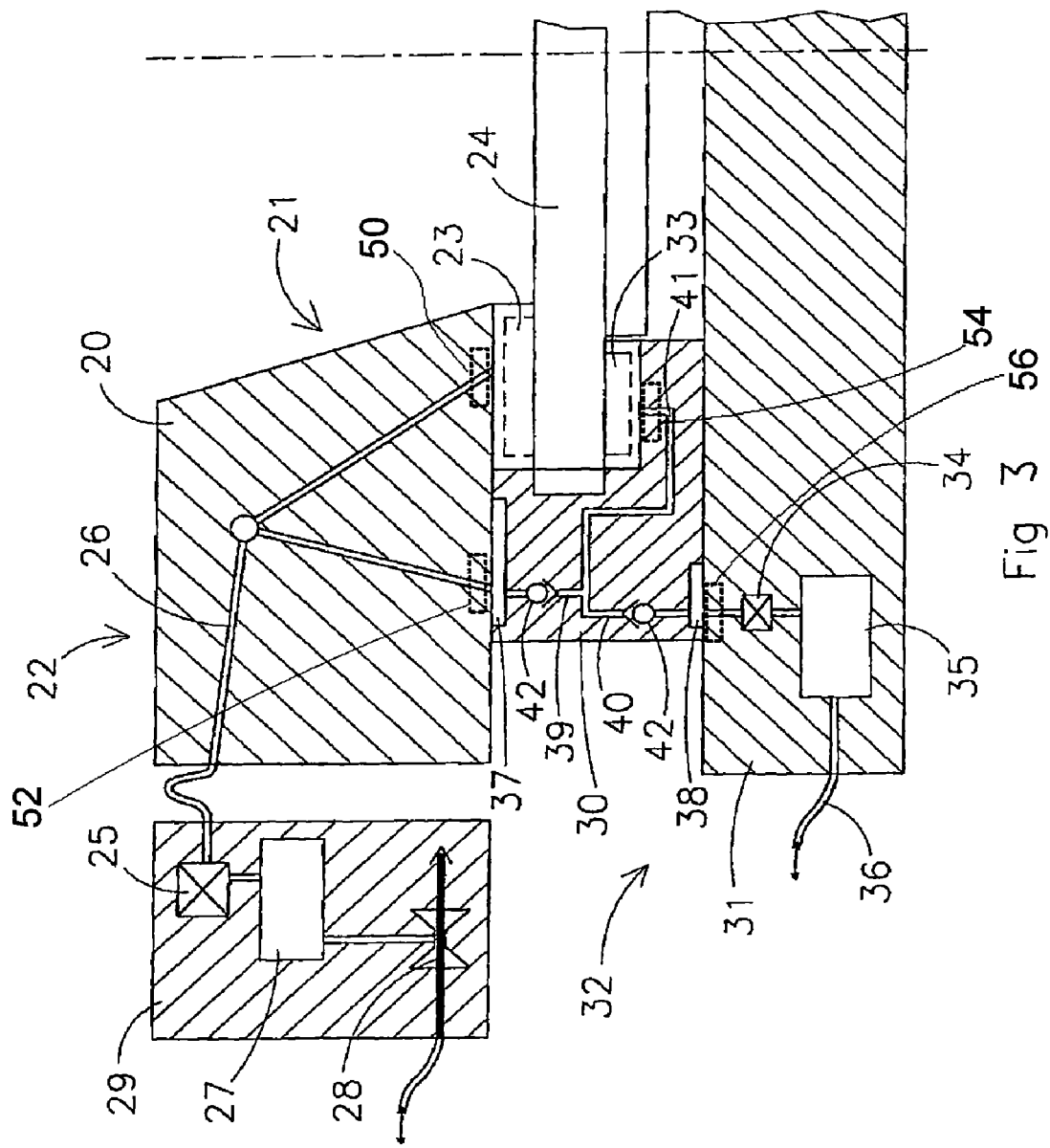
FIG. 3 depicts a patterning device support supporting a patterning device according to a second embodiment of the invention.

FIG. 3 shows a second embodiment of (a part of) a patterning device support 20 with a clamping device 21 according to an embodiment of the present invention. In this embodiment, the lithographic apparatus includes a vacuum device 22 having a vacuum pad 23 which is placed against the top side of a patterning device 24 to create a vacuum between the top side of the patterning device 24 and the vacuum pad 23 which is arranged on the patterning device support 20. The vacuum device 22 further includes a vacuum valve 25 which is connected with the vacuum pad 23 by a vacuum line 26. The vacuum valve 25 is further connected with a vacuum buffer 27 and a vacuum pump 28 which function as vacuum sources, as explained in relation with the embodiment shown in FIG. 2. The vacuum valve 25, the vacuum buffer 27 and the vacuum pump 28 are arranged on a movable cable support 29, for instance a cable shuttle so that the time needed to obtain a required vacuum level, or to take away this vacuum, is reduced compared to the vacuum device of the known lithographic apparatus wherein these parts are located on a stationary frame. In an embodiment, the vacuum pump is of a type according to the Venturi-principle, because such pump can be made light of weight.

The patterning device 24 is placed in a carrying device 30 configured to carry the patterning device 24 during projection when the patterning device 24 is supported on the patterning device support 20 and also during exchange of a patterning device 24 whereby the carrying device 30 is held by a patterning device exchange device 31, such as an exchange robot, turret or any other suitable type of exchange device.

The lithographic apparatus includes a second vacuum device 32 having a vacuum pad 33 which is arranged on the carrying device 30 and rests against the patterning device 24 so that it can create a clamping force which can hold the patterning device. This clamping force can be used during projection to provide a further clamping of the patterning device and during exchange for holding the patterning device 24.

A vacuum valve 34 and a vacuum buffer 35 as vacuum source have been arranged in the patterning device exchange device 31. The vacuum buffer 35 is connected with a further vacuum source via a vacuum line 36. This further vacuum source may be a further vacuum buffer and/or a vacuum pump, which for instance are arranged on a frame of the lithographic apparatus. It is also possible to arrange one or more further vacuum sources on or in the patterning device carrying device.

The carrying device 30 includes a second vacuum pad 37 and a third vacuum pad 38. The vacuum pad 37 can be placed against the patterning device support to create a vacuum clamping force between the patterning device support 20 and the carrying device 30. The vacuum pad 38 can be placed against the patterning device exchange device 31 to create a vacuum clamping force between the carrying device 30 and the patterning device exchange device 31.

The vacuum in the vacuum pad 33 is provided through one (or both) of the vacuum pads 37 and 38 via vacuum lines 39 and 40, respectively and a common vacuum line 41. In each of the vacuum lines 39, 40 a non-return valve 42 is placed so that the vacuum in the vacuum pad 33 can be maintained when there is no vacuum in one (or both) of the vacuum pads 37 or 38, i.e. when the respective one of these vacuum pads is directly connected with local environment so that the air pressure in the respective vacuum pad correspond with the air pressure in the local environment.

In this arrangement each of the vacuum device 22 and the second vacuum device 32 can be used to create a vacuum in the vacuum pad 33 to exert a clamping force on the underside of the patterning device 24. In particular during projection phase, i.e. when the patterning device is held in the patterning device support 20, the vacuum device 22 is used to create and maintain a vacuum between the patterning device 24 and the carrying device 30 with vacuum pad 33 and also between the patterning device 24 and the patterning device support 20 with the vacuum pad 23. The carrying device 30 is held by the patterning device support 20 with the vacuum pad 37.

During exchange of a patterning device 24, the carrying device 30 which carries the patterning device 24 is held by the patterning device exchange device 31. The carrying device 30 which carries the patterning device 24 is held by the patterning device exchange device 31. The carrying device 30 is clamped on the patterning exchange device 31 with the vacuum pad 38, while the patterning device 24 is clamped on the carrying device 30 with the vacuum pad 33, whereby the vacuum created in these vacuum pads is provided and maintained by the second vacuum device 32. In an embodiment, electrostatic clamping device 50 exerts a clamping force on substantially the same part of the patterning device 24 as vacuum device 23 and electrostatic clamping device 54 exerts a clamping force on substantially the same part of the patterning device 24 as vacuum device 33. Furthermore, electrostatic clamping device 52 exerts a clamping force on substantially the same part of the carrying device 30 as vacuum device 37 and electrostatic clamping device 56 exerts a clamping force on substantially the same part of the carrying device 30 as vacuum device 38. According to an embodiment of the invention, it is also possible to use any other type or combination of types of clamping devices such as magnetic, electromagnetic and hydraulic clamping devices. In an embodiment, the two types of clamping devices exert a clamping force on the same part i.e. in substantially overlapping areas, of the patterning device so that the available claiming surface area on the patterning device 24 is optimally used.

Since the vacuum lines 39 and 40 are connected via the common vacuum line 41 and due to the presence of the non-return valves, the vacuum created by one of the vacuum device 22 and the second vacuum device 32 may beneficially be maintained in the common line 41 of the carrying device 30 during a transition from the projection phase to the exchange phase or vice versa. As a result the patterning device 24 will during such transition be continuously clamped to the carrying device 30 which avoids any movement of the patterning device with respect to the carrying device 30 and therefore avoids image errors.

In the above described embodiments, the term vacuum is used to describe a gas/air pressure level which is substantially lower than the gas/air pressure in the local environment, normally the atmospheric pressure. This substantially lower air pressure is used to create a clamping force between two objects, in particular between the patterning device support and the patterning device. To obtain a sufficient high clamping force (and therewith friction force), the air pressure should be lower than a certain level.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
   an illumination system configured to condition a radiation beam;
   a patterning device support constructed to hold a patterning device, the patterning device being capable of imparting the radiation beam with a pattern in its cross-section to form a patterned radiation beam;
   a stationary frame comprising a vacuum pump and a first vacuum buffer;
   a cable support or cable shuttle, that is a movable part, configured to carry cables between said patterning device support and the stationary frame of the lithographic apparatus, wherein the cable support or cable shuttle is distinct and separate from the patterning device support and the stationary frame of the lithographic apparatus;
   a second vacuum buffer located on the cable support or cable shuttle configured to be closer to the patterning device support than the stationary frame so as to reduce the time needed to obtain a low pressure level sufficient to close a vacuum valve and to thereby reduce the time required for exchanging patterning devices;
   a substrate table constructed to hold a substrate;
   a projection system configured to project the patterned radiation beam onto a target portion of the substrate; and
   a clamping device configured to clamp said patterning device at a side of said patterning device that faces the illumination system.

2. The lithographic apparatus of claim 1, wherein the clamping device comprises a vacuum device configured to create a vacuum between said side of said patterning device that faces the illumination system and said patterning device support.

3. The lithographic apparatus of claim 2, wherein said vacuum device comprises the vacuum valve, said valve being arranged on or proximate said patterning device support.

4. The lithographic apparatus of claim 2, wherein said vacuum device comprises the vacuum valve, said valve being arranged on said cable support or cable shuttle that is distinct and separate from the patterning device support and is configured to at least partially follow movements of said patterning device support.

5. The lithographic apparatus of claim 2, wherein said vacuum device comprises a vacuum source, said vacuum source being arranged on or proximate said patterning device support.

6. The lithographic apparatus of claim 5, wherein said vacuum source comprises a vacuum buffer and/or a vacuum pump.

7. The lithographic apparatus of claim 2, wherein said vacuum device comprises a vacuum source, said vacuum source being arranged on said cable support or cable shuttle configured to at least partially follow movements of said patterning device support.

8. The lithographic apparatus of claim 1, wherein the clamping device comprises an electrostatic device configured to hold said patterning device with an electrostatic force.

9. The lithographic apparatus of claim 1, further comprising two or more types of clamping devices configured to clamp said patterning device during projection of the patterned beam.

10. The lithographic apparatus of claim 9, wherein said two or more types of clamping devices are configured to exert a clamping force on substantially overlapping areas of said side of said patterning device that faces the illumination system during projection of the patterned beam.

11. The lithographic apparatus of claim 1, further comprising a carrying device configured to carry the patterning device, said carrying device being configured to be held during exchange by a patterning device exchange device and a vacuum device.

12. The lithographic apparatus of claim 11, wherein said vacuum device is further configured to create a vacuum between said carrying device and said patterning device support.

13. The lithographic apparatus of claim 11, further comprising a second vacuum device configured to create a vacuum between an underside of the patterning device and the patterning device support.

14. The lithographic apparatus of claim 13, wherein said second vacuum device is further configured to create a vacuum between said carrying device and said patterning device exchange device.

15. The lithographic apparatus of claim 13, wherein a second vacuum valve and/or a vacuum source of said second vacuum device are arranged on or in said patterning device exchange device.

16. The lithographic apparatus of claim 13, wherein vacuum lines of said vacuum device and said second vacuum device are linked with the interposition of one-way valves so that said vacuum device and said second vacuum device can create a vacuum between the underside of said patterning device and said carrying device.

17. A lithographic apparatus comprising:
   an illumination system configured to condition a radiation beam;
   a patterning device support constructed to hold a patterning device, the patterning device being capable of imparting the radiation beam with a pattern in its cross-section to form a patterned radiation beam;
   a stationary frame comprising a vacuum pump and a first vacuum buffer;
   a cable support or cable shuttle, that is a movable part, configured to carry cables between said patterning device support and the stationary frame of the lithographic apparatus, wherein the cable support or cable shuttle is distinct and separate from the patterning device support and the stationary frame of the lithographic apparatus;
   a second vacuum buffer located on the cable support or cable shuttle configured to be closer to the patterning device support than the stationary frame so as to reduce the time needed to obtain a low pressure level sufficient to close a vacuum valve and to thereby reduce the time required for exchanging patterning devices;
   a substrate table constructed to hold a substrate;
   a projection system configured to project the patterned radiation beam onto a target portion of the substrate; and two or more types of clamping devices, that are configured to exert a clamping force on substantially overlapping areas of at least a side of said patterning device that faces the illumination system.

18. The lithographic apparatus of claim 17, wherein the clamping device comprises a vacuum device configured to create a vacuum between said side of said patterning device that faces the illumination system and said patterning device support.

19. The lithographic apparatus of claim 18, wherein said vacuum device comprises the vacuum valve, said valve being arranged on or proximate said patterning device support.

20. The lithographic apparatus of claim 18, wherein said vacuum device comprises the vacuum valve, said valve being arranged on said cable support or cable shuttle that is distinct and separate from the patterning device support and is configured to at least partially follow movements of said patterning device support.

21. The lithographic apparatus of claim 18, wherein said vacuum device comprises a vacuum source, said vacuum source being arranged on or proximate said patterning device support.

22. The lithographic apparatus of claim 21, wherein said vacuum source comprises a vacuum buffer and/or a vacuum pump.

23. The lithographic apparatus of claim 18, wherein said vacuum device comprises a vacuum source, said vacuum source being arranged on said cable support or cable shuttle configured to at least partially follow movements of said patterning device support.

24. The lithographic apparatus of claim 17, further comprising a carrying device configured to carry the patterning device, said carrying device being configured to be held during exchange by a patterning device exchange device.

25. The lithographic apparatus of claim 24, wherein a vacuum device is further configured to create a vacuum between said carrying device and said patterning device support.

26. The lithographic apparatus of claim 24, further comprising a second vacuum device configured to create a vacuum between an underside of the patterning device and the patterning device support.

27. The lithographic apparatus of claim 26, wherein said second vacuum device is further configured to create a vacuum between said carrying device and said patterning device exchange device.

28. The lithographic apparatus of claim 26, wherein a second vacuum valve and/or a vacuum source of said second vacuum device are arranged on or in said patterning device exchange device.

29. The lithographic apparatus of claim 26, wherein vacuum lines of a vacuum device and said second vacuum device are linked with the interposition of one-way valves so that said vacuum device and said second vacuum device can create a vacuum between the underside of said patterning device and said carrying device.

30. A device manufacturing method comprising:
holding a patterning device with a patterning device support;
patterning a beam of radiation with the patterning device to form a patterned beam of radiation; and
projecting the patterned beam of radiation onto a substrate,
wherein said holding includes clamping the patterning device at a top side thereof to an underside of the patterning device support, and
wherein the above steps are accomplished by using a lithography apparatus comprising:
a stationary frame comprising a vacuum pump and a first vacuum buffer;
a cable support or cable shuttle, that is a movable part, configured to carry cables between said patterning device support and the stationary frame of the lithographic apparatus, wherein the cable support or cable shuttle is distinct and separate from the patterning device support and the stationary frame of the lithographic apparatus;
a second vacuum buffer located on the cable support or cable shuttle configured to be closer to the patterning device support than the stationary frame so as to reduce the time needed to obtain a low pressure level sufficient to close a vacuum valve and to thereby reduce the time required for exchanging patterning devices.

31. A device manufacturing method comprising:
patterning a beam of radiation with a patterning device to form a patterned beam of radiation;
projecting the patterned beam of radiation onto a substrate; and
during projection of the patterned beam, exerting a clamping force on substantially overlapping areas of a side of the patterning device that faces the beam of radiation with two or more types of clamping devices, and
wherein the above steps are accomplished by using a lithography apparatus comprising:
a stationary frame comprising a vacuum pump and a first vacuum buffer;
a cable support or cable shuttle, that is a movable part, configured to carry cables between said patterning device support and the stationary frame of the lithographic apparatus, wherein the cable support or cable shuttle is distinct and separate from the patterning device support and the stationary frame of the lithographic apparatus;
a second vacuum buffer located on the cable support or cable shuttle configured to be closer to the patterning device support than the stationary frame so as to reduce the time needed to obtain a low pressure level sufficient to close a vacuum valve and to thereby reduce the time required for exchanging patterning devices.

* * * * *